United States Patent [19]

Fossum et al.

[11] Patent Number: 5,236,871
[45] Date of Patent: Aug. 17, 1993

[54] METHOD FOR PRODUCING A HYBRIDIZATION OF DETECTOR ARRAY AND INTEGRATED CIRCUIT FOR READOUT

[75] Inventors: Eric R. Fossum, Venice; Frank J. Grunthaner, Glendale, both of Calif.

[73] Assignee: The United States of America as represented by the Administrator of the National Aeronautics and Space Administration, Washington, D.C.

[21] Appl. No.: 877,966

[22] Filed: Apr. 29, 1992

[51] Int. Cl.⁵ .................................. H01L 21/44
[52] U.S. Cl. ............................ 437/195; 437/3; 437/5; 437/203; 437/234; 148/DIG. 80
[58] Field of Search ........... 437/195, 184, 185, 5, 437/3, 180, 181, 183, 203; 148/DIG. 80; 257/442, 444; 250/332

[56] References Cited

U.S. PATENT DOCUMENTS

| | | |
|---|---|---|
| 3,913,217 | 10/1975 | Misawa et al. ............ 437/183 |
| 4,197,633 | 4/1980 | Lorenze, Jr. et al. ........ 437/185 |
| 4,317,125 | 2/1982 | Hughes et al. ............ 437/184 |
| 4,339,870 | 7/1982 | Ball et al. . |
| 4,521,798 | 6/1985 | Baker .................... 257/444 |
| 4,559,695 | 12/1985 | Baker .................... 437/3 |
| 4,612,083 | 9/1986 | Yasumoto et al. . |
| 4,727,047 | 2/1988 | Bozler et al. . |
| 4,735,908 | 4/1988 | Higashi et al. . |
| 4,740,700 | 4/1988 | Shaham et al. . |
| 4,846,931 | 7/1989 | Gmitter et al. . |
| 4,868,902 | 9/1989 | Sato . |
| 4,883,561 | 11/1989 | Gmitter et al. . |
| 4,926,051 | 5/1990 | Turnbull . |
| 4,935,627 | 6/1990 | Zimmermann et al. . |
| 4,943,491 | 7/1990 | Norton et al. . |
| 5,155,362 | 10/1992 | Baker .................... 250/332 |

FOREIGN PATENT DOCUMENTS 2239555 7/1991 United Kingdom ............ 437/5

*Primary Examiner*—Brian E. Hearn
*Assistant Examiner*—Michael Trinh
*Attorney, Agent, or Firm*—John H. Kusmiss; Thomas H. Jones; Guy M. Miller

[57] ABSTRACT

A process for fabricating a detector array in a layer of semiconductor material on one substrate and an integrated readout circuit in a layer of semiconductor material on a separate substrate in order to select semiconductor material for optimum performance of each structure, such as GaAs for the detector array and Si for the integrated readout circuit. The detector array layer is lifted off its substrate, laminated on the metallized surface of the integrated surface, etched with reticulating channels to the surface of the integrated circuit, and provided with interconnections between the detector array pixels and the integrated readout circuit through the channels. The adhesive material for the lamination is selected to be chemically stable to provide electrical and thermal insulation and to provide stress release between the two structures fabricated in semiconductor materials that may have different coefficients of thermal expansion.

7 Claims, 2 Drawing Sheets

METHOD FOR PRODUCING A HYBRIDIZATION OF DETECTOR ARRAY AND INTEGRATED CIRCUIT FOR READOUT

ORIGIN OF INVENTION

The invention described herein was made in the performance of work under a NASA contract, and is subject to the provisions of Public Law 96-517 (35 USC 202) in which the contractor has elected not to retain title.

TECHNICAL FIELD

The invention relates to a lift-off and laminate process for fabricating semiconductor apparatus, and more particularly to a process in which a semiconductor layer is separately grown on a substrate, processed into a semiconductor structure, such as an array of photodiodes, that is then lifted off and laminated onto a prefabricated semiconductor integrated circuit for interaction with the first structure, such as reading out the pixel data of the photodiode array through the laminating layer.

BACKGROUND ART

The advancement of future detector arrays in new materials is hindered by the readout requirement of the many signals emanating from the array. For small array sizes, wire bonding or wire interconnects to array periphery can be used to read out individual detectors; but for larger arrays, a multiplexer circuit is needed.

For silicon detectors, CCD multiplexers have been used for readout. However, the silicon detector is generally limited to the visible and near IR portion of the spectrum. CCD multiplexers are often limited by either signal capacity or operating temperature. Additionally, the monolithic integration of the detector and multiplexer places constraints on detector fill-factor or readout smear.

The switched-FET type of multiplexer (typically silicon CMOS) has been used to read out HgCdTe detector arrays operating in the IR wavelength region. In that case, the detectors and multiplexers are fabricated in separate processes and then interconnected through the use of a solder (or indium) "bump" bond. Bump bonding is a fairly well-established technology for array sizes up to 256×256 pixels. For larger arrays, bonding yields become a concern. In addition, the physical size of the bump can place a limitation on pixel spacing. A more serious concern is the matching of thermal expansion coefficients between the detector array material and the multiplexer material. In this case, failure of the hybridized imager can occur after repeated thermal cycling.

An emerging potential technology for integration of detector arrays and multiplexers is the epitaxial growth of the detector material on the readout multiplexer (or vice-versa). For example, HgCdTe on sapphire has been tried with modest success. However, there are three difficulties with this approach. First, the lattice constant of the detector material must match that of the readout material. This seriously limits the choice of multiplexer and detector material combination, though it can be relieved somewhat through the use of strained layer interfaces. Second, from a manufacturing perspective, the process yield of the multiplexer fabrication M is multiplied by the yield of the detector material growth D, which in turn is multiplied by the detector fabrication F yield. Thus, the overall manufacturing yield MDF can be expected to be poor due to the sequential processing. Third, the thermal expansion mismatch in the otherwise lattice matched materials can be expected to again lead to thermal cycling reliability problems.

More recent developments relate to a lift-off process for removing a very thin film of semiconductor material so that it may be transferred to a semiconductor substrate of different composition. See U.S. Pat. Nos. 4,846,931 and 4,883,561 to Thomas J. Gmitter and Eli Yablonovitch. The first patent discloses a method for removing an epitaxial film from a single crystal substrate upon which it is grown using a thin release layer ($\leq 1000$ Å) and applying a polymeric support layer on the epitaxial film after it is grown. The polymeric support layer is under tension over the epitaxial film to be lifted off so that, as the thin release layer is etched away progressively from the edges, the polymeric support layer will curve away from the single crystal substrate, thus lifting the epitaxial thin film.

That film thus lifted may be a single layer or multiple epitaxial layers and may be metallized for making electrical contacts to an integrated circuit formed in the thin film. That integrated circuit thus formed and lifted off a single crystal substrate may then be attached by an adhesive or other force to a structure of different material, such as an optical fiber. The second patent cited above, which is a continuation-in-part of the first, teaches adhering the thin film on a second substrate, typically different in composition than that of the thin film.

While the impetus for the present invention has been the fabrication of large photodetector arrays with an integrated circuit for accessing the array, the solution to the problem has more general application to any need of separately fabricating two planar semiconductor circuits, laminating the planar semiconductor circuits with a layer of planarizing adhesive, and then providing electrical connections between the circuits for interaction. The ability to optimize the performance of each circuit and/or the fabrication process for each is but one advantage. A more general advantage is the ability to provide a more compact structure for the interactive circuits.

STATEMENT OF THE INVENTION

Accordingly, a general objective is to separately process two planar semiconductor structures complete with metallized surface contacts on two separate semiconductor layers grown and processed on separate substrates and then remove one structure from its substrate and laminate that one structure onto the other using adhesive material selected for insulation (electrical and preferably also thermal) and stability. This adhesive material serves as a planarizing intermediate layer and provides the additional important function of thermal expansion stress relief between the structures. Electrical connections are then provided for interaction between the two structures by thin film metallization via channels (holes or grooves) etched through the one structure down to contacts metallized on the surface of the other structure which remains supported by its substrate.

In accordance with one embodiment of the invention, a plurality of photodetector diodes are fabricated in an array by epitaxially growing a layer of semiconductor material on a first substrate and processing it into an array of photodetector diodes, each with a separate metallized surface contact and at least one second contact for a plurality of photodetector diodes; fabricating an integrated circuit required for readout of the photodetector diode array in a separate layer of semiconductor material grown on a second substrate with metallization of surface contacts on the integrated circuit; applying a planarizing film of adhesive over the surface of the integrated circuit; separating the detector array from the first substrate; laminating the detector array onto the planarized surface of the integrated circuit; etching channels for reticulation of the photodetector diodes; and providing electrical connections between the surface contacts of the photodetector array and the surface contacts of the integrated circuit via the reticulating channels read out of the detector array.

The novel features that are considered characteristic of this invention are set forth with particularity in the appended claims. The invention will best be understood from the following description when read in connection with the accompanying drawings.

DETAILED DESCRIPTION OF THE INVENTION

The general object of the invention is achieved in a specific embodiment illustrated in FIGS. 1-5 by way of example and not by way of limitation, keeping in mind that a detector array of photodiodes is but a special case of a structure that may be fabricated in a layer of semiconductor material prior to lamination onto a planar surface of and interconnection with an integrated circuit prefabricated in a separate layer of semiconductor material supported by a separate substrate. The semiconductor material for one structure is optimized for the application and grown separately on a substrate, or over a layer grown on the substrate, that is capable of being selectively etched by proper choice of chemistry while the semiconductor material for the other structure is optimized for its function. Thus, a hybrid structure is provided for a detector array and an integrated circuit for readout control of the detector array. The only constraint on the optimizing selection of detector material is that the material be capable of being grown epitaxially on a substrate or on a compositionally selected buried layer that can be selectively etched.

The planar integrated circuit is fabricated and prepared separately with an appropriate pattern of metallization for interconnection with the detector array. After the layer of detector material is lifted off by etching, it is laminated onto the prefabricated integrated circuit. The planar surface of the integrated circuit is prepared to receive the detector array by coating it with a planarizing layer of chemically stable adhesive material that possesses electrical insulating properties, and preferably thermal insulating properties as well, such as polyamide with an adhesion promoter. This adhesive material, which serves as a laminator for the two planar semiconductor chips, namely the detector array chip and the integrated circuit readout control chip, also serves as a stress reliever between the two semiconductor chips.

After lamination, channels are etched through the detector array chip in a desired pattern for reticulation of the photodiodes in the array. Thin-film metal interconnections are then deposited between the detector array surface contacts via the channels to the surface contacts of the integrated circuit to complete the fabrication process. This approach decouples the manufacturing yield of the detector array from that of the controlling integrated circuit, and permits use of optimum semiconductor material for photodetection while the integrated circuit is fabricated in semiconductor material selected for optimum readout performance of the detector array while the laminator provides relief of any stress due to mismatch in thermal expansion coefficients during operation, an advantage not found in the bump-bonding technology or lattice-matched epitaxial growth technologies for structures of different material compositions.

Figure 1:
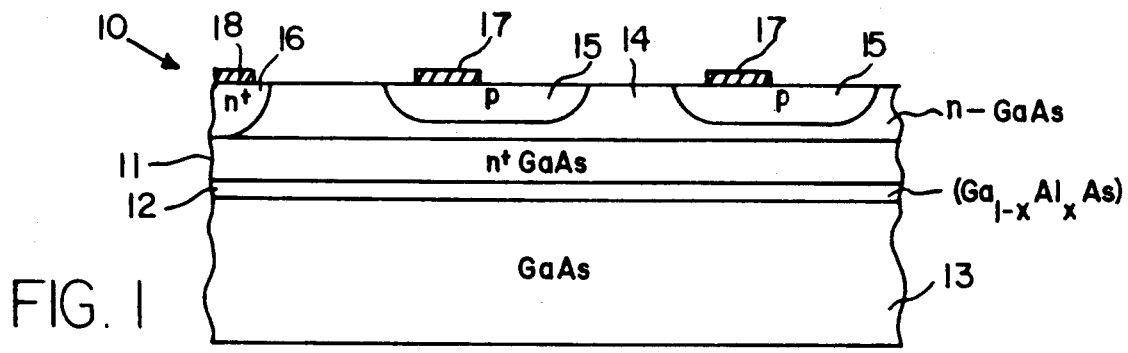
FIG. 1 illustrates schematically a small cross section of a large array of photodiodes fabricated in an epitaxial layer of GaAs selected for optimum photodetection and grown over a thin epitaxial layer of $Ga_{1-x}Al_xAs$ on a substrate of GaAs such that the detector array fabricated in the layer of GaAs may be lifted off by selectively etching the buried layer of $Ga_{1-x}Al_xAs$.

Referring to FIG. 1, a small cross section of a large detector array 10 is shown comprised of a semiconductor layer 11, such as n++ GaAs epitaxially grown on a compositionally selected buried layer 12 over a GaAs substrate 13. The only constraint on the material for the buried layer 12 is that it be selectively etched by proper choice of chemistry, such as $Ga_{1-x}Al_xAs$ which can be etched by HF. The layer 11 is heavily doped with n-type conductivity modifiers to serve as a common back contact for all photodiodes fabricated in an epitaxially grown layer 14 of n-GaAs. Separate areas 15 are heavily diffused with p-type conductivity modifiers to form an array of p-n photodiodes 15, only two of which are shown in the small cross section illustrated in FIG. 1. One back contact area 16 is heavily diffused with n-type modifiers down to the layer 11 of n+GaAs. After the array 10 has been fabricated, ohmic contacts 17 are metallized for the detector diodes 15 of the array, and an ohmic contact 18 is metallized for one common back contact to all of the photodiodes via the n+ GaAs layer 11.

It should be appreciated that the separate areas 15 and the metallized contacts 17 for the photodiodes of the array are not drawn to scale. In practice, the area devoted to each metallized contact is minimized while the detector areas 15 are maximized by minimizing the space between the adjacent detector areas 15, thereby maximizing the fill factor of the array. As will be noted more fully below with reference to FIG. 5, the space between the adjacent detector areas 15 present in all four directions of a two-dimensional surface is etched in a grid pattern to form channels through the layer 11 that reticulate the array. These channels are also used to form bridging interconnections between the metallized surface contacts 17 and surface contacts of a separate planar integrated circuit to which the photodetector array is laminated after it is lifted off the substrate 13 by etching the buried layer 12 as will be described below with reference to FIGS. 3 and 4.

Figure 2:
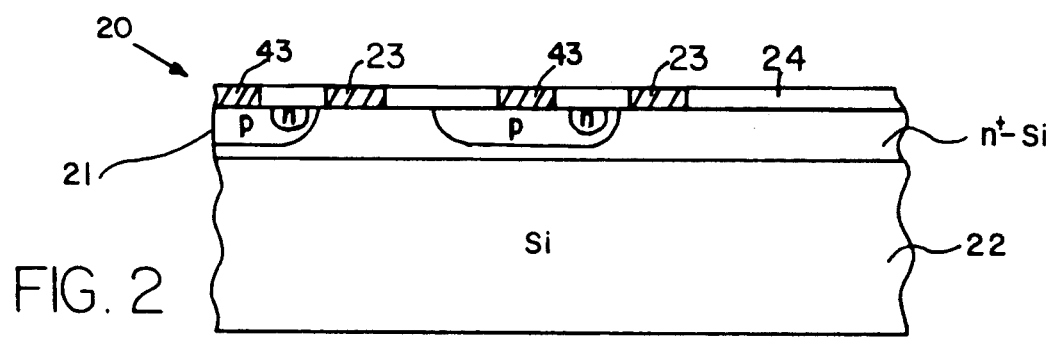
FIG. 2 illustrates schematically an integrated circuit (IC) designed for readout of the detector array fabricated in an epitaxial layer of n-Si grown on a separate Si substrate. After metallization of surface contacts, it is covered with a layer of adhesive material for planarizing the IC surface.

In a separate process, an integrated circuit 20 necessary for readout control of a large detector array, such as a switched silicon CMOS integrated circuit control of the detector array 10, is fabricated in a layer 21 of n-type silicon epitaxially grown on a silicon substrate 22, as shown schematically in FIG. 2. Fabrication is completed with metallization of an appropriate pattern of conductors 43 and ohmic contacts 23 to interconnect the integrated circuit 20 with the detector array 10. The contacts are preferably metallized with platinum, tungsten or titanium.

Before lifting the detector array 10 from the substrate 13 shown in FIG. 1 and laminating the detector array over the integrated circuit 24 shown in FIG. 2, both the detector array and the integrated circuit can be independently probed for functional testing in order that defective structures may be rejected without further processing, thus increasing the yield of acceptable devices.

Figure 3:
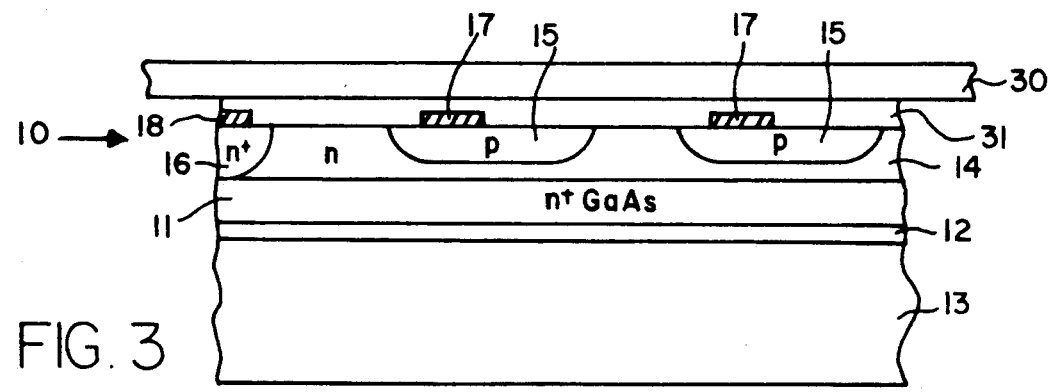
FIG. 3 illustrates the detector array of FIG. 1 held on a temporary support by a suitable soluble adhesive while etching the $Ga_{1-x}Al_xAs$ layer away for lifting off the detector array.
Figure 4:
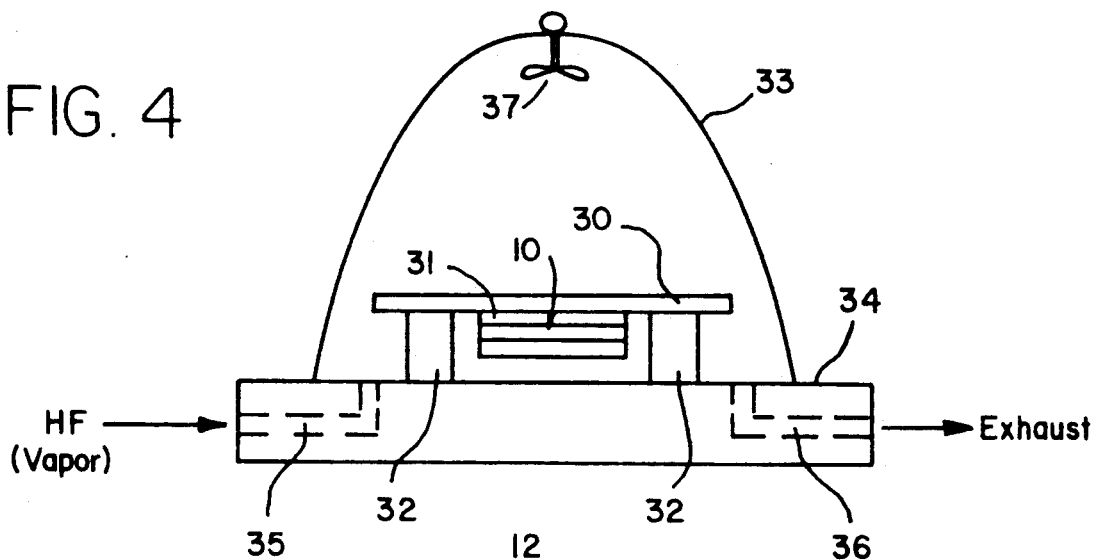
FIG. 4 illustrates a lift-off technique by vapor etching the intermediate $Ga_{1-x}Al_xAs$ layer of the structure in FIG. 3.

The detector array 10 may be lifted from its substrate in the manner described in the aforesaid U.S. Pat. No. 4,846,931 by applying a polymeric support layer which is under tension while selectively etching the buried layer 12 with liquid hydrofluoric acid. Alternatively, the detector array may be lifted from its substrate by temporarily affixing a polyethylene coated support 30 as shown in FIG. 3 to the metallized surface of the detector array 10, using a suitable release agent 31 such as thermoplastic polyethylene that is attacked by surfactants. The support is then placed over polyethylene coated blocks 32 under a polyethylene-lined bell jar 33, as shown in FIG. 4, with the substrate 13 suspended above a polyethylene base 34 for the bell jar. Polyethylene is used in order to use HF vapor as an etchant.

HF vapor is injected into the bell jar through a channel 35 and exhausted through a channel 36 in the polyethylene base 34, but first the bell jar is evacuated. The HF vapor etches the buried layer 12 of $Ga_{1-x}Al_xAs$ starting on the edges. To minimize etching time, a polyethylene coated fan 37 may be used to continually circulate the HF vapor injected through the channel 35 and exhausted through the channel 36 and to further minimize etching time fresh HF vapor may be continually injected while spent HF vapor is exhausted. Once the substrate 13 drops, the flow of HF vapor is shut off and the remaining vapor in the bell jar is evacuated through the exhaust channel 36.

After metallization of the necessary ohmic contacts 23 on the integrated circuit 20, a planarizing layer 24 of adhesive material is placed over the metallized integrated circuit. The adhesive may be any material that can be applied in a thin film, such as a polyamide with a suitable adhesion promoter. The only constraint is that it be chemically stable, provide electrical insulation and preferably provide thermal insulation as well. It could also be a Langmuir-Blodgett film selected for its extraordinary adhesive, uniform thickness, and conformal properties.

Figure 5:
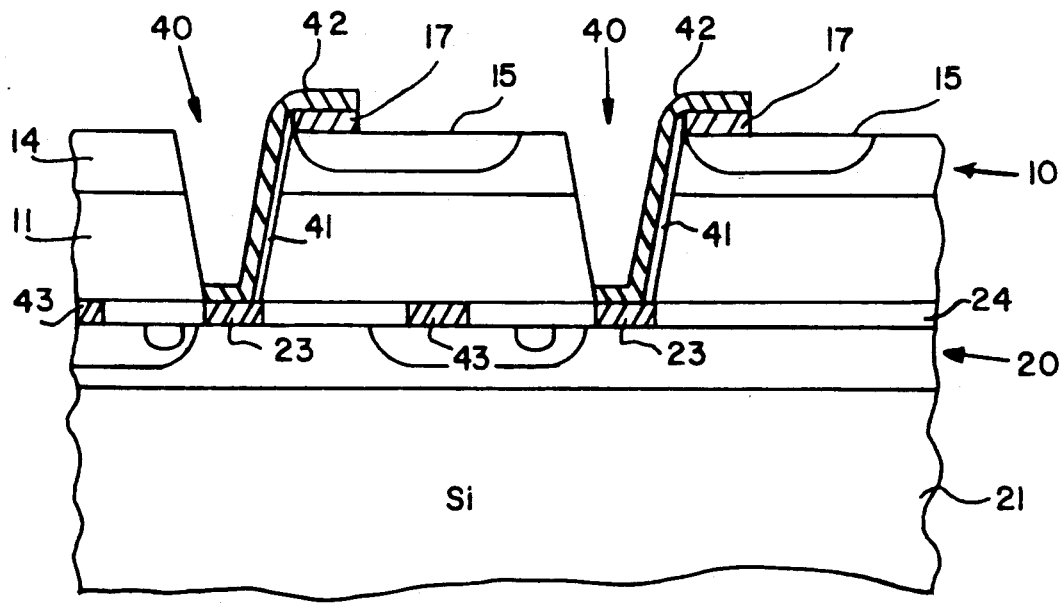
FIG. 5 illustrates the hybrid structure of a GaAs detector array and Si integrated circuit to form a laminated composite structure with reticulating channels etched in the GaAs detector array. Those channels are used for metallization of interconnections between metallized surface contacts of the integrated circuit and metallized surface contacts of the detector array.

The adhesive layer 24 used to laminate the detector array 10 over the integrated circuit in the completed hybrid as shown schematically in FIG. 5, serves as an insulating layer between the integrated circuit 20 and the detector array 10. That layer not only provides the important function of electrical insulation, and the additional important function of thermal insulation, but also thermal expansion stress release due to any difference in the coefficients of thermal expansion of the different semiconductor materials used for the detector array 10 and integrated circuit 20.

Once the detector array 10 is etched away from the substrate 13, it is placed on the planarizing adhesive layer 24, as shown in FIG. 2, while still attached to the support 30 by the release agent 31. Since the etching of the detector array 10 from the substrate 13 may take as many as ten or more minutes, the planarizing adhesive layer 24 is not applied to the integrated circuit layer 21 until the detector array 10 has been lifted off of its substrate 13 and ready to be laminated onto the integrated circuit 20.

To facilitate alignment of the detector array 10 on top of the integrated circuit 20, as shown in FIG. 5, the metallization pattern on each is provided with a pattern to mark all four corners of each. Then by subsequent ion beam etching, each is cut along the sides of the corner marks. The edges of the detector array may then be aligned with the edges of the multiplexer chip to assure alignment of the integrated circuit metallized contacts with the metallized contacts of the detector array.

Once the detector array 10 is affixed to the integrated circuit 20 through the planarizing adhesive layer 24, the support 30 is released using a suitable solvent for the release agent 31, and the surface of the detector array 10 is prepared with a photoresist for etching channels 40 in the detector array to the integrated circuit contacts 23, as shown in FIG. 5, using a suitable etchant for the GaAs layer of the detector array 10 and then a solvent for any of the adhesive layer 24 over the contacts 23. It should be noted that FIG. 5 is not drawn to scale and the vertical dimensions are not to the same scale as the horizontal dimensions in order to facilitate illustrating the invention. In practice, the etched channels will be much wider at the top with walls having a much smaller slope.

Once the channels have been etched and cleaned by an ultrasonic rinse, an insulating $SiO_2$ or $Si_3N_4$ film 41 is produced by ECR (electron cyclotron resonance) particle beam on the walls of the channels on which interconnections 42 are to be metallized. Metallization of interconnections 42 from the photodetector contacts 17 to the metallized contacts 23 on the integrated circuit 20 through the etched channels 40 then completes the fabrication process.

An alternative technique for providing interconnections between contacts 17 of the detector array 10 and contacts 23 of the integrated circuit 20 is to electroplate metal posts in the channels once the walls have been insulated. Connections between the posts and the contacts 17 are than assured by metallization of a conductor over both. Although the adhesive layer 24 will relieve stresses due to thermal expansion of the structures, further precaution against any cracks developing in the interconnections between the laminated structures may be taken by providing air bridge interconnections. The technique is to deposit a bump of material over the insulating film on the channel walls and then selectively etch that material after metallization of interconnections where desired. The result is a connection of a length greater than the space being bridged so that it may flex freely should there be any undue thermal expansion stresses.

Although particular embodiments of the invention have been described and illustrated herein, it is recognized that modifications may readily occur to those skilled in the art, particularly in selection of material for the detector array, such as InGaAs, InAs, InP, etc., for IR detection. Consequently, it is intended that the claims be interpreted to cover such modifications.

We claim:

1. A method for producing a hybrid semiconductor structure comprising the steps of separately processing into semiconductor structures at least two separate semiconductor layers grown and processed into first and second semiconductor structures on respective first and second substrates, each with metallized ohmic contacts on respective surfaces thereof, removing said first structure from said first substrate, applying a planarizing layer of adhesive material on said surface having metallized ohmic contacts of said second structure, laminating said first structure on said adhesive layer over said second structure with said surface having metallized ohmic contacts of said first structure away from said adhesive material, etching channels through said surface having metallized ohmic contacts of said first structure to said surface having metallized ohmic contacts of said second structure, and providing electrical interconnections therebetween through said etched channels for interaction between said first and second semiconductor structures.

2. A method as defined in claim 1 wherein said electrical interconnections between said ohmic contacts on said surface having metallized ohmic contacts of said first structure and said ohmic contacts on said surface having metallized ohmic contacts of said second structure are provided by producing an electrical insulating film on a wall of each channel and metallizing an interconnection over said insulating film of each channel for each metallized ohmic contact on said surface having metallized ohmic contacts of said first structure.

3. A method as defined in claim 1 wherein said two semiconductor layers are comprised of different semiconductor materials selected for individual optimum performance of said first and second semiconductor structures, and said adhesive material is selected to provide electrical insulation and to relieve stress in said structures due to any difference in coefficients of thermal expansion of said different semiconductor materials selected for said two separate semiconductor layers processed into said first and second structures.

4. A method as defined in claim 3 wherein said adhesive material is selected to additionally provide thermal insulation.

5. A method for producing a hybrid semiconductor structure comprising the steps of producing a detector array of photodiodes in a layer of epitaxially grown layer of semiconductor material on a first substrate, said detector array comprising an array of photodiodes with ohmic contacts on a surface thereof, fabricating in a separate layer of semiconductor material grown on a second substrate an integrated circuit required for readout of said photodiodes in said detector array with ohmic contacts on a surface thereof, applying a planarizing film of adhesive material over said surface having metallized ohmic contacts of said integrated circuit, separating said detector array from said first substrate, laminating said separated detector array on said planarizing film on said surface of said integrated circuit, etching reticulating channels for each of said photodiodes through said detector array to said metallized ohmic contacts of said integrated circuit, leaving one metallized ohmic contact between channels for each reticulated photodiode, and providing electrical interconnections between said detector array metallized ohmic contacts and said integrated circuit metallized ohmic contacts through said channels of the readout of said detector array.

6. A method as defined in claim 5 wherein said semiconductor material for said layer on said first substrate is selected for optimum performance of said detector array, and said semiconductor material for said layer on said second substrate is selected to be a different material than said semiconductor material for said layer on said first substrate for optimum performance of said integrated circuit, and wherein said adhesive material is selected to provide electrical insulation and to relieve stress in said layer for said detector array an said layer for said integrated circuit due to any difference in coefficients of thermal expansion of materials for each of said layers.

7. A process for fabricating a semiconductor detector array, laminating it to a prefabricated integrated circuit structure, and providing electrical interconnections for readout of said array by said integrated circuit structure, comprising the steps of fabricating said semiconductor detector array in semiconductor material grown on a substrate capable of being selectively etched, said semiconductor array consisting of separate pixel areas for detecting photons and integrating electrons produced by detected photons, and metallizing a separate pixel ohmic contact on each pixel area through which integrated electrons may be selectively read out, said metallized pixel ohmic contacts being in a predetermined spatial array, fabricating said integrated circuit structure separately, said integrated circuit structure having one separate metallized ohmic contact for each metallized pixel ohmic contact of said detector array in a spatial array corresponding to said spatial array of said metallized pixel ohmic contacts for each of said pixel areas, separating said detector array from said substrate by selectively etching said detector away from said substrate, laminating said separated detector array over said integrated circuit structure with each of said spatial array of metallized pixel ohmic contacts offset from a corresponding integrated circuit metallized ohmic contact such that space beside each metallized pixel ohmic contact is positioned over a separate one of said integrated circuit metallized ohmic contact, etching reticulating channels for each pixel area to expose a separate one of said metallized integrated circuit ohmic contacts for each pixel area, producing an electrical insulating film on a wall of each channel, and metallizing an interconnection of each metallized pixel ohmic contact to a separate one of said metallized integrated circuit ohmic contacts exposed by said etched channel beside each pixel.

* * * * *